(12) United States Patent
Igarashi et al.

(10) Patent No.: US 11,848,215 B2
(45) Date of Patent: Dec. 19, 2023

(54) METHOD FOR MANUFACTURING ELECTRONIC DEVICE

(71) Applicant: MITSUI CHEMICALS TOHCELLO, INC., Tokyo (JP)

(72) Inventors: Kouji Igarashi, Nordrhein-Westfalen (DE); Jin Kinoshita, Nagoya (JP); Hiroyoshi Kurihara, Nagoya (JP); Toru Miura, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 696 days.

(21) Appl. No.: 17/044,129

(22) PCT Filed: Mar. 19, 2019

(86) PCT No.: PCT/JP2019/011335
§ 371 (c)(1),
(2) Date: Sep. 30, 2020

(87) PCT Pub. No.: WO2019/188543
PCT Pub. Date: Oct. 3, 2019

(65) Prior Publication Data
US 2021/0020461 A1 Jan. 21, 2021

(30) Foreign Application Priority Data
Mar. 30, 2018 (JP) .................. 2018-066900

(51) Int. Cl.
*H01L 21/56* (2006.01)
*C09J 7/38* (2018.01)
(Continued)

(52) U.S. Cl.
CPC ............ *H01L 21/568* (2013.01); *B32B 37/06* (2013.01); *B32B 37/12* (2013.01); *B32B 37/182* (2013.01);
(Continued)

(58) Field of Classification Search
CPC ... H01L 21/568; H01L 21/561; H01L 21/565; H01L 21/6835; H01L 21/78; H01L 24/96;
(Continued)

(56) References Cited

U.S. PATENT DOCUMENTS 6,864,119 B2 3/2005 Seko
8,436,481 B2 5/2013 Hoshino et al.
(Continued)

FOREIGN PATENT DOCUMENTS

EP 2639277 A1 9/2013
JP 2004128337 A 4/2004
(Continued)

OTHER PUBLICATIONS

International Search Report (PCT/ISA/210) dated May 14, 2019, by the Japan Patent Office as the International Searching Authority for International Application No. PCT/JP2019/011335.
(Continued)

*Primary Examiner* — Elias Ullah
(74) *Attorney, Agent, or Firm* — BUCHANAN INGERSOLL & ROONEY PC

(57) ABSTRACT

The method for manufacturing an electronic device includes at least: a step of preparing a structure provided with an adhesive film provided with a base material layer, an adhesive resin layer (A) provided on a first surface side of the base material layer and for temporarily fixing an electronic component, and an adhesive resin layer (B) provided on a second surface side of the base material layer and in which an adhesive force is decreased by an external stimulus, an electronic component attached to the adhesive resin layer (A) of the adhesive film, and a support substrate attached to the adhesive resin layer (B) of the adhesive film; at least one step selected from a step of decreasing water content in the adhesive film and a step of decreasing water content in the
(Continued)

structure; and a step of sealing the electronic component with a sealing material.

11 Claims, 4 Drawing Sheets

(51) Int. Cl.
| | |
|---|---|
| *B32B 37/06* | (2006.01) |
| *B32B 37/12* | (2006.01) |
| *B32B 37/18* | (2006.01) |
| *C09J 5/00* | (2006.01) |
| *C09K 3/10* | (2006.01) |
| *H01L 21/683* | (2006.01) |
| *H01L 21/78* | (2006.01) |
| *H01L 23/00* | (2006.01) |

(52) U.S. Cl.
CPC ............. *C09J 5/00* (2013.01); *C09J 7/385* (2018.01); *C09K 3/10* (2013.01); *H01L 21/561* (2013.01); *H01L 21/565* (2013.01); *H01L 21/6835* (2013.01); *H01L 21/78* (2013.01); *H01L 24/96* (2013.01); *B32B 2457/00* (2013.01); *C09J 2203/326* (2013.01); *C09J 2301/124* (2020.08); *C09J 2301/502* (2020.08); *C09J 2433/00* (2013.01); *C09K 2200/0647* (2013.01); *H01L 2221/68386* (2013.01); *H01L 2224/95001* (2013.01)

(58) Field of Classification Search
CPC . H01L 2221/68386; H01L 2224/95001; H01L 24/19; H01L 2224/12105; H01L 23/3128; H01L 2924/12041; H01L 2924/14; H01L 2924/181; H01L 21/56; H01L 21/6836; H01L 2221/68381; B32B 37/06; B32B 37/12; B32B 37/182; B32B 2457/00; C09J 5/00; C09J 7/385; C09J 2203/326; C09J 2301/124; C09J 2301/502; C09J 2433/00; C09J 7/38; C09J 2301/1242; C09J 2301/412; C09J 133/066; C09J 133/04; C09J 2301/312; C09K 3/10; C09K 2200/0647; C08F 220/1804

See application file for complete search history.

(56) References Cited

U.S. PATENT DOCUMENTS

| | | |
|---|---|---|
| 9,822,284 B2 | 11/2017 | Usugi et al. |
| 2004/0063332 A1 | 4/2004 | Seko |
| 2011/0151625 A1 | 6/2011 | Hoshino et al. |
| 2014/0044957 A1 | 2/2014 | Hirayama |
| 2016/0208144 A1 | 7/2016 | Usugi et al. |
| 2017/0140948 A1 | 5/2017 | Kimura et al. |

FOREIGN PATENT DOCUMENTS

| | | |
|---|---|---|
| JP | 2007027623 A | 2/2007 |
| JP | 2011134811 A | 7/2011 |
| WO | 2015/029871 A1 | 3/2015 |
| WO | 2017/170452 A1 | 10/2017 |

OTHER PUBLICATIONS

Written Opinion (PCT/ISA/237) dated May 14, 2019, by the Japan Patent Office as the International Searching Authority for International Application No. PCT/JP2019/011335.

Extended European Search Report dated Nov. 30, 2021, issued by the European Patent Office in corresponding European Application No. 19775431.0-1212. (9 pages).

Notice of Reasons for Refusal dated Nov. 2, 2021, by the Japanese Patent Office in corresponding Japanese Patent Application No. 2020-510722 and an English translation of the Notice. (6 pages).

METHOD FOR MANUFACTURING ELECTRONIC DEVICE

TECHNICAL FIELD

The present invention relates to a method for manufacturing an electronic device.

BACKGROUND ART

As a technology which is able to reduce the size and weight of electronic devices (for example, semiconductor apparatuses), a fan-out type WLP (wafer level package) is being developed.

In an eWLB (Embedded Wafer Level Ball Grid Array), which is one of the methods for manufacturing a fan-out type WLP, it is possible to adopt a method in which a plurality of electronic components such as semiconductor chips are temporarily fixed in a separated state on an adhesive film attached to a support substrate, and the plurality of electronic components are sealed in a batch with a sealing material. Here, the adhesive film needs to be fixed to the electronic component and the support substrate in the sealing step or the like and needs to be removed from the sealed electronic component and the support substrate after the sealing.

Examples of a technique related to such a fan-out type WLP manufacturing method include the technique described in Patent Document 1 (Japanese Patent Laid-Open No. 2011-134811).

Patent Document 1 discloses a heat-resistant adhesive sheet for manufacturing a semiconductor apparatus, which is used by being attached when resin-sealing a substrateless semiconductor chip, in which the heat resistant adhesive sheet has a base material layer and an adhesive layer, the adhesive layer has an adhesive force to SUS304 after bonding of 0.5 N/20 mm or more, is cured by a stimulus received until the completion of a resin sealing step, and has a peel force with respect to a package of 2.0 N/20 mm or less.

RELATED DOCUMENT

Patent Document

[Patent Document 1] Japanese Patent Laid-Open No. 2011-134811

SUMMARY OF THE INVENTION

Technical Problem

According to studies by the inventors of the present invention, it is clear that, when an electronic component is arranged on an adhesive film and the electronic component is sealed with a sealing material, the position of the electronic component may be shifted (also referred to below as position shifting of the electronic component).

The present invention was made in view of the above circumstances and provides a method for manufacturing an electronic device capable of suppressing position shifting of electronic components in a sealing step.

Solution to Problem

The inventors of the present invention carried out intensive studies in order to achieve the above object. As a result, it was found that performing a step of decreasing water content in an adhesive film or a step of decreasing water content in a structure including an adhesive film makes it possible to suppress position shifting of electronic components in a sealing step, thereby completing the present invention.

According to the present invention, the method for manufacturing an electronic device illustrated below is provided.

[1]
A method for manufacturing an electronic device, including at least: a step (1) of preparing a structure having: an adhesive film having: a base material layer; an adhesive resin layer (A) for temporarily fixing an electronic component, which is provided on a first surface side of the base material layer; and an adhesive resin layer (B) in which an adhesive force is decreased by an external stimulus, which is provided on a second surface side of the base material layer;
  an electronic component attached to the adhesive resin layer (A) of the adhesive film;
  and a support substrate attached to the adhesive resin layer (B) of the adhesive film;
  at least one step (2) selected from a step (2-1) of decreasing water content in the adhesive film and a step (2-2) of decreasing water content in the structure;
  and a step (3) of sealing the electronic component with a sealing material.

[2]
The method for manufacturing an electronic device according to [1],
  in which the step (2) includes the step (2-2) of decreasing the water content in the adhesive film, and the step (2-1) is performed before the step (1).

[3]
The method for manufacturing an electronic device according to [2],
  in which, in the step (2-1), the water content in the adhesive film is decreased by heating the adhesive film and/or depressurizing the adhesive film.

[4]
The method for manufacturing an electronic device according to [1],
  in which the step (2) includes the step (2-2) of decreasing the water content in the structure,
  and the step (2-2) is performed between the step (1) and the step (3).

[5]
The method for manufacturing an electronic device according to [4],
  in which, in the step (2-2), the water content in the structure is decreased by heating the structure and/or depressurizing the structure.

[6]
The method for manufacturing an electronic device according to [4] or [5],
  in which the step (2) is performed immediately before the step (3).

[7]
The method for manufacturing an electronic device according to any one of [1] to [6],
  further including a step (4) of peeling the support substrate from the structure by decreasing an adhesive force of the adhesive resin layer (B) by applying an external stimulus, after the step (3).

[8]
The method for manufacturing an electronic device according to [7], further including a step (5) of peeling the adhesive film from the electronic component, after the step (4).

[9]
The method for manufacturing an electronic device according to any one of [1] to [8],
in which an interval between the step (2) and the step (3) is within 12 hours.

[10]
The method for manufacturing an electronic device according to any one of [1] to [9],
in which the sealing material is an epoxy resin-based sealing material.

[11]
The method for manufacturing an electronic device according to any one of [1] to [10],
in which the adhesive resin layer (A) includes a (meth)acrylic adhesive resin.

Advantageous Effects of Invention

According to the present invention, it is possible to provide a method for manufacturing an electronic device capable of suppressing position shifting of electronic components in a sealing step.

BRIEF DESCRIPTION OF THE DRAWINGS

The object described above and other objects, features, and advantages will be further clarified by the preferable embodiments described below and the accompanying drawings below.

DESCRIPTION OF EMBODIMENTS

Figure 1:
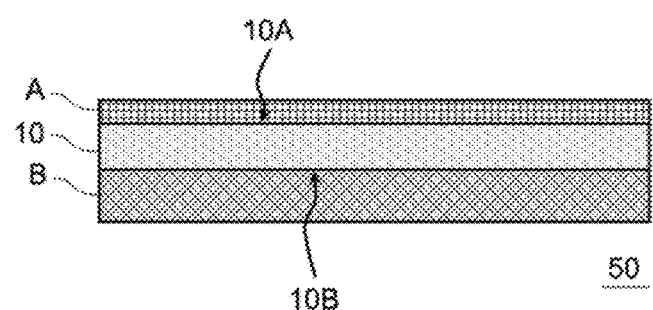
FIG. 1 is a cross-sectional view schematically showing an example of a structure of an adhesive film of an embodiment according to the present invention.

A description will be given below of embodiments of the present invention with reference to the drawings. In all the drawings, common reference numerals are given to the same constituent components and description thereof will be appropriately omitted. In addition, the figures are schematic views and do not match the actual dimensional ratios. In addition, unless otherwise specified, "A to B" in the numerical range represents A or more and B or less. In addition, in the present embodiment, "(meth)acrylic" means acrylic, methacrylic, or both acrylic and methacrylic.

1. Method for Manufacturing Electronic Device

First, a description will be given of a method for manufacturing an electronic device according to the present embodiment. FIG. 1 is a cross-sectional view schematically showing an example of the structure of an adhesive film 50 of an embodiment according to the present invention.

Figure 2:
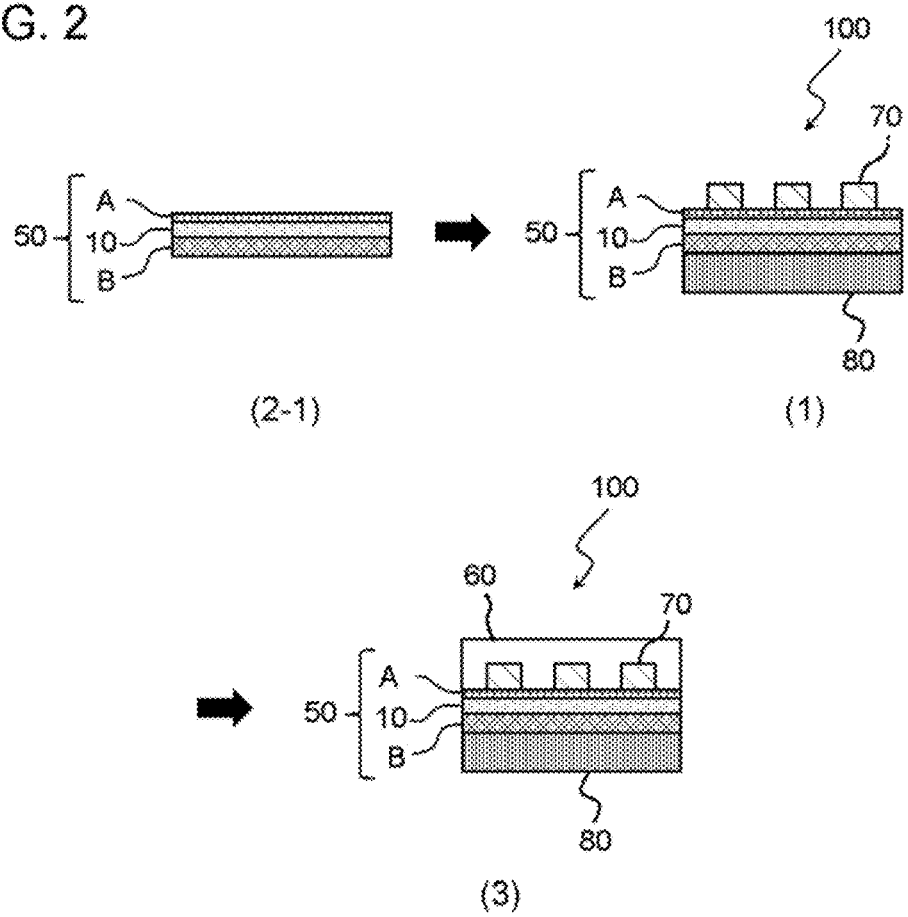
FIG. 2 is a cross-sectional view schematically showing an example of a method for manufacturing an electronic device of an embodiment according to the present invention.
Figure 3:
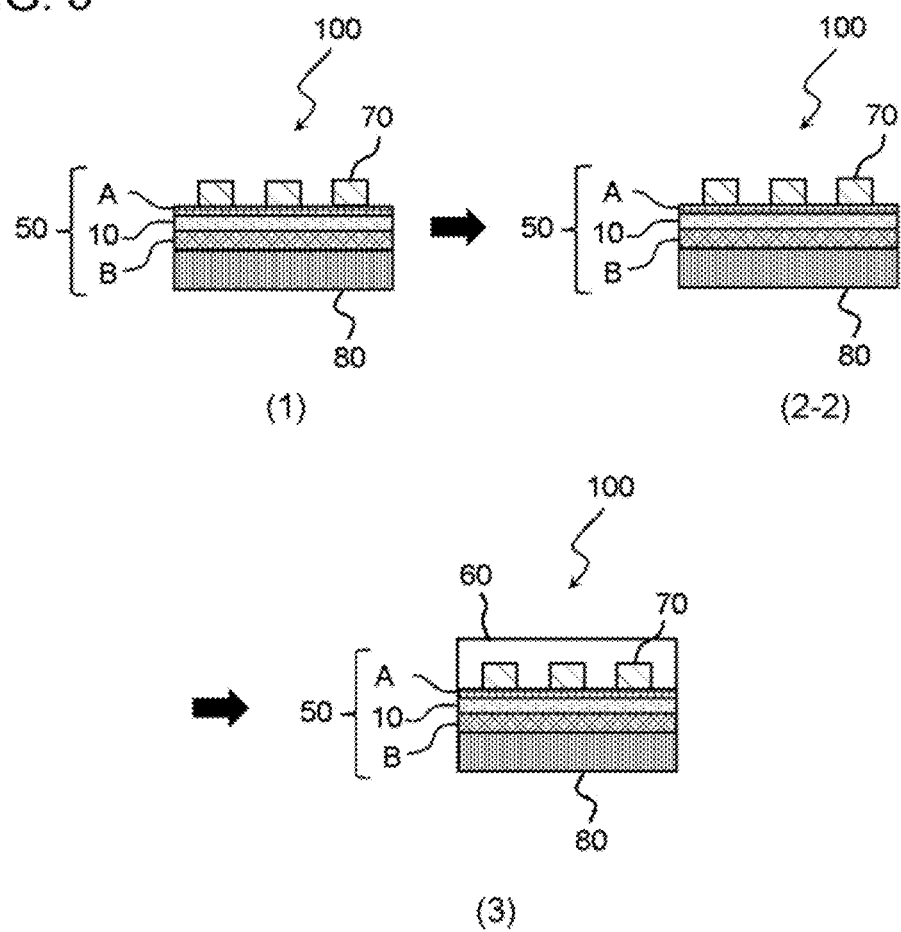
FIG. 3 is a cross-sectional view schematically showing an example of a method for manufacturing an electronic device of an embodiment according to the present invention.
Figure 4:
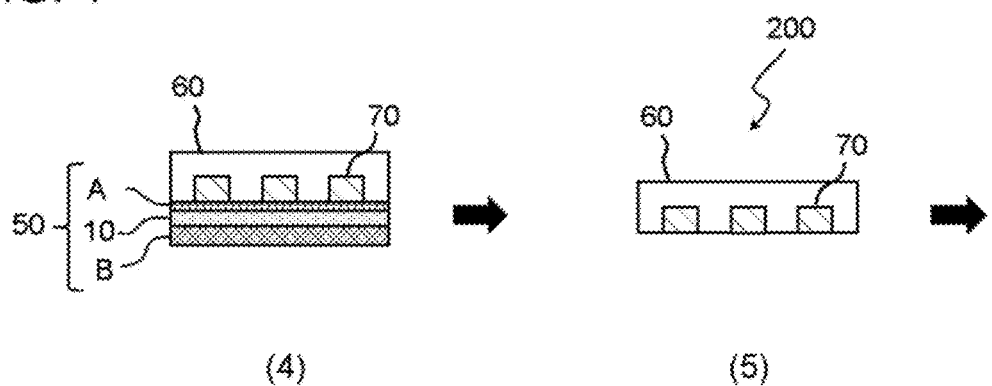
FIG. 4 is a cross-sectional view schematically showing an example of a method for manufacturing an electronic device of an embodiment according to the present invention.
Figure 4:
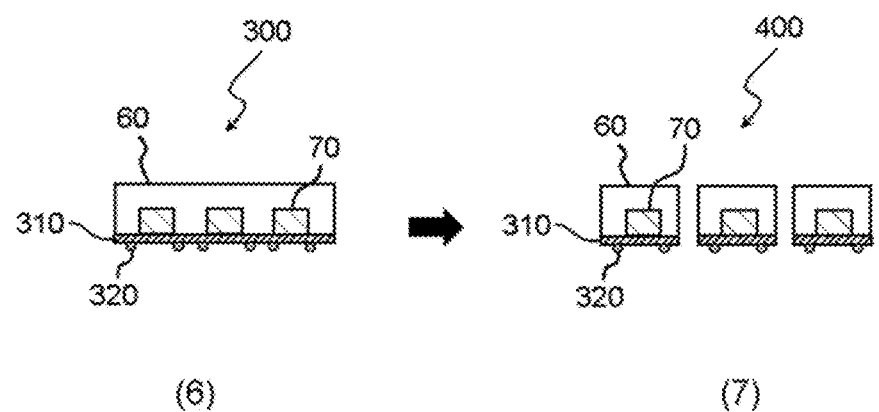

FIGS. 2 to 4 are cross-sectional views schematically showing an example of a method for manufacturing an electronic device of an embodiment according to the present invention.

The method for manufacturing an electronic device according to the present embodiment is provided with at least the following three steps.

(1) A step of preparing a structure 100 provided with an adhesive film 50 provided with a base material layer 10, an adhesive resin layer (A) provided on a first surface 10A side of the base material layer 10 and for temporarily fixing an electronic component 70, and an adhesive resin layer (B) provided on a second surface 10B side of the base material layer 10 and in which an adhesive force is decreased by an external stimulus, an electronic component 70 attached to the adhesive resin layer (A) of the adhesive film 50, and a support substrate 80 attached to the adhesive resin layer (B) of the adhesive film 50; (2) At least one step selected from a step (2-1) of decreasing water content in the adhesive film 50 and a step (2-2) of decreasing water content in the structure 100; and (3) A step of sealing the electronic component 70 with a sealing material 60.

As described above, according to studies by the inventors of the present invention, it is clear that, when an electronic component is arranged on an adhesive film and the electronic component is sealed with a sealing material, the position of the electronic component may be shifted (referred to below as position shifting of the electronic component).

The inventors of the present invention carried out extensive studies in order to achieve the above object. As a result, it was found that, in a step of sealing an electronic component, outgas derived from water included in an adhesive film, particularly, outgas derived from water included in an adhesive resin layer on a side to be attached to a support substrate, causes position shifting of the electronic component.

The inventors of the present invention carried out further studies based on the findings described above. As a result, it was found for the first time that performing at least one step (2) selected from step (2-1) of decreasing water content in the adhesive film 50 and step (2-2) of decreasing water content in the structure 100 makes it possible to suppress position shifting of the electronic component in the sealing step.

That is, according to the method for manufacturing an electronic device according to the present embodiment, performing at least one step (2) selected from a step (2-1) of decreasing water content in the adhesive film 50 and a step (2-2) of decreasing water content in the structure 100 makes it possible to suppress the generation of outgas derived from water included in the adhesive film, in particular, outgas derived from water included in the adhesive resin layer on the side to be attached to the support substrate, in the step of sealing an electronic component and, as a result, it is possible to suppress position shifting of the electronic component in the sealing step.

As described above, according to the method for manufacturing an electronic device according to the present embodiment, it is possible to suppress the position shifting of the electronic component in the sealing step.

A description will be given below of each step of the method for manufacturing an electronic device according to the present embodiment.

(Step (1))

In step (1), the structure 100 is prepared which is provided with the adhesive film 50, the electronic component 70 attached to the adhesive resin layer (A) of the adhesive film 50, and the support substrate 80 attached to the adhesive resin layer (B) of the adhesive film 50.

It is possible to manufacture the structure 100 by the following procedure, for example.

First, the adhesive film 50 is adhered on the support substrate 80 such that the adhesive resin layer (B) is on the support substrate 80 side. A protective film may be attached on the adhesive resin layer (B) and it is possible to peel the protective film and to adhere the exposed surface of the adhesive resin layer (B) to the surface of the support substrate 80.

As the support substrate 80, for example, it is possible to use a quartz substrate, a glass substrate, a SUS substrate, or the like.

Next, it is possible to obtain the structure 100 by arranging the electronic component 70 on the adhesive resin layer (A) of the adhesive film 50 adhered on the support substrate 80.

Examples of the electronic component 70 include a semiconductor chip such as an IC, an LSI, a discrete, a light emitting diode, or a light receiving element, a semiconductor panel, a semiconductor package, or the like.

(Step (2))

Step (2) includes at least one step selected from step (2-1) of decreasing water content in the adhesive film 50 and step (2-2) of decreasing water content in the structure 100.

As shown in FIG. 2, step (2-1) is preferably performed before step (1). That is, it is preferable to decrease the water content in the adhesive film 50 in the stage before the structure 100 is manufactured. By doing so, in the stage before cutting to an appropriate size, for example, it is possible to decrease the water content in the adhesive film 50 in a roll state and to more efficiently decrease the water content in the structure 100.

In step (2-1), it is possible to decrease the water content in the adhesive film 50 by heating the adhesive film 50 and/or depressurizing the adhesive film 50, for example.

On the other hand, as shown in FIG. 3, step (2-2) is preferably performed between step (1) and step (3), and more preferably performed immediately before step (3). Performing step (2-2) immediately before step (3) makes it possible to further suppress position shifting of the electronic component in the sealing step.

In step (2-2), for example, heating the structure 100 and/or depressurizing the structure 100 makes it possible to decrease the water content in the structure 100.

In the method for manufacturing an electronic device according to the present embodiment, the interval between step (2) and step (3) is preferably within 12 hours, more preferably within 6 hours, even more preferably within 3 hours, and particularly preferably within 1 hour. By doing so, it is possible to suppress water in the atmosphere from being adsorbed to the adhesive film 50 or the structure 100 between step (2) and step (3). Due to this, in the step of sealing the electronic component, it is possible to further suppress the generation of outgas derived from water included in the adhesive film 50 or the structure 100, and as a result, it is possible to further suppress position shifting of the electronic component in the sealing step.

In step (2), the temperature when heating the adhesive film 50 or the structure 100 is not particularly limited as long as it is a temperature at which it is possible to decrease the water content included in the adhesive film 50 or the structure 100 without causing deterioration in the adhesive film 50 or the structure 100; however, for example, the temperature is preferably in a range of 80° C. or higher and 180° C. or lower, and more preferably in a range of 100° C. or higher and 150° C. or lower.

The time for heating the adhesive film 50 or the structure 100 is not particularly limited as long as it is a heating time at which it is possible to decrease the water content in the adhesive film 50 or the structure 100 without causing deterioration in the adhesive film 50 or the structure 100; however, for example, the time is in a range of 1 minute or more and 120 minutes or less, and preferably 5 minutes or more and 60 minutes or less.

The method for heating the adhesive film 50 or the structure 100 is not particularly limited; however, for example, it is possible to use a generally known heat treatment method such as an oven, a dryer, a heating roll, a drying oven, or the like.

In a case of depressurizing the adhesive film 50 or the structure 100, the pressure during depressurization is, for example, 100 Pa or more and 10000 Pa or less.

The method for depressurizing the adhesive film 50 or the structure 100 is not particularly limited; however, for example, it is possible to use a generally known depressurizing method such as a vacuum dryer.

It is possible to adjust the water content by heating or depressurizing the adhesive film 50 or the structure 100 as described above; however, when heating at a temperature over 125° C., the pressure during depressurization is preferably 500 Pa or more in order to prevent the peeling of the electronic component 70 and the adhesive film 50.

It is possible to determine whether the water content in the adhesive film 50 or the structure 100 has decreased by a known method such as thermogravimetric analysis.

(Step (3))

Next, the electronic component 70 is sealed with the sealing material 60.

The electronic component 70 is covered with the sealing material 60 and the electronic component 70 is sealed by curing the sealing material 60 at a temperature of 150° C. or lower, for example.

In addition, the form of the sealing material 60 is not particularly limited, but is, for example, a granular form, a sheet form or a liquid form.

The sealing material 60 is not particularly limited, but, for example, it is possible to use an epoxy resin-based sealing material using an epoxy resin.

In particular, a liquid epoxy resin-based sealing material is preferable from the viewpoint of better affinity of the sealing material 60 with the adhesive film 50 and being able to more evenly seal the electronic component 70.

As such an epoxy resin-based sealing material, for example, it is possible to use the T693/R4000 series, T693/R1000 series, T693/R5000 series, and the like manufactured by Nagase Chemtex Corp.

Examples of the sealing method include transfer molding, injection molding, compression molding, cast molding, and the like. After sealing the electronic component 70 with the sealing material 60, for example, the sealing material 60 is cured by heating at a temperature of 150° C. or less and the structure 100 in which the electronic component 70 is sealed is obtained.

(Step (4))

As shown in FIG. 4, the method for manufacturing an electronic device according to the present embodiment may be further provided with a step (4) of peeling the support substrate 80 from the structure 100 by decreasing the adhesive force of the adhesive resin layer (B) by applying an external stimulus, after the step (3).

It is possible to easily remove the support substrate 80 from the adhesive film 50 by, for example, sealing the electronic component 70 and then heating at a temperature over 150° C. to decrease the adhesive force of the adhesive resin layer (B).

(Step (5))

As shown in FIG. 4, the method for manufacturing an electronic device according to the present embodiment may be further provided with a step (5) of peeling the adhesive film 50 from the electronic component 70 to obtain the electronic device 200, after step (4).

Examples of a method for peeling the adhesive film 50 from the electronic component 70 include a mechanical peeling method, a method for peeling the adhesive film 50 after decreasing the adhesive force of the surface of the adhesive film 50, and the like.

(Step (6))

As shown in FIG. 4, the method for manufacturing an electronic device according to the present embodiment may be further provided with a step (6) of forming a wiring layer 310 and a bump 320 on the exposed surface of the obtained electronic device 200 to obtain an electronic device 300.

The wiring layer 310 is provided with a pad (not shown) which is an external connection terminal formed on the outermost surface, and a wiring (not shown) which electrically connects the exposed electronic component 70 and the pad. The wiring layer 310 is able to be formed by a method known in the related art and may have a multi-layer structure.

Then, it is possible to form the bump 320 on the pad of the wiring layer 310 and obtain the electronic device 300. Examples of the bump 320 include a solder bump, a gold bump, and the like. It is possible to form the solder bump, for example, by arranging a solder ball on a pad which is an external connection terminal of the wiring layer 310 and carrying out heating to melt (reflow) the solder. It is possible to form the gold bump by methods such as a ball bonding method, a plating method, or an Au ball transfer method.

(Step (7))

The method for manufacturing an electronic device according to the present embodiment may be further provided with a step (7) of dicing the electronic device 300 to obtain a plurality of electronic devices 400, as shown in FIG. 4.

It is possible to perform the dicing of the electronic device 300 by a known method.

2. Adhesive Film

A description will be given below of the adhesive film 50 according to the present embodiment.

FIG. 1 is a cross-sectional view schematically showing an example of the structure of the adhesive film 50 of an embodiment according to the present invention.

As shown in FIG. 1, the adhesive film 50 according to the present embodiment is provided with the base material layer 10, the adhesive resin layer (A) provided on the first surface 10A side of the base material layer 10, and the adhesive resin layer (B) provided on the second surface 10B side of the base material layer 10 and having an adhesive force decreased by an external stimulus.

From the viewpoint of the balance between mechanical properties and handleability, the total thickness of the adhesive film 50 according to the present embodiment is preferably 10 μm or more and 1000 μm or less, and more preferably 20 μm or more and 500 μm or less.

Next, a description will be given of each layer forming the adhesive film 50 according to the present embodiment.

<Base Material Layer>

The base material layer 10 is a layer provided for the purpose of improving properties such as the handleability, mechanical properties, and heat resistance of the adhesive film 50.

The base material layer 10 is not particularly limited and examples thereof include a resin film.

It is possible to use a known thermoplastic resin as the resin forming the resin film. Examples thereof include one type or two or more types selected from polyolefins such as polyethylene, polypropylene, poly(4-methyl-1-pentene), and poly(1-butene); polyesters such as polyethylene terephthalate, polybutylene terephthalate, and polyethylene naphthalate; polyamides such as nylon-6, nylon-66, and polymethaxylene adipamide; polyacrylates; polymethacrylates; polyvinyl chloride; polyvinylidene chloride; polyimides; polyetherimides; ethylene/vinyl acetate copolymers; polyacrylonitrile; polycarbonates; polystyrenes; ionomers; polysulfones; polyethersulfones; polyphenylene ether, and the like.

Among the above, from the viewpoint of excellent balance of transparency, mechanical strength, price, and the like, one type or two or more types selected from polypropylene, polyethylene terephthalate, polyethylene naphthalate, polyamide, and polyimide are preferable, and at least one type selected from polyethylene terephthalate and polyethylene naphthalate is more preferable.

The base material layer 10 may be a single layer or two or more types of layers.

In addition, the form of the resin film used to form the base material layer 10 may be a stretched film, or may be a uniaxially or biaxially stretched film; however, from the viewpoint of improving the mechanical strength of the base material layer 10, the film is preferably a uniaxially or biaxially stretched film.

From the viewpoint of obtaining good film properties, the thickness of the base material layer 10 is preferably 1 μm or more and 500 μm or less, more preferably 5 μm or more and 300 μm or less, and even more preferably 10 μm or more and 250 μm or less.

The base material layer 10 may be surface-treated in order to improve the adhesion with other layers. Specifically, a corona treatment, a plasma treatment, an undercoat treatment, a primer coat treatment, or the like may be performed.

<Adhesive Resin Layer (A)>

The adhesive resin layer (A) is a layer provided on one surface side of the base material layer 10, and, for example, is a layer for contacting the surface of the electronic component to temporarily fix the electronic component when the electronic component is sealed with a sealing material in the electronic device manufacturing step.

The adhesive resin layer (A) includes an adhesive resin (A1).

Examples of the adhesive resin (A1) include (meth) acrylic adhesive resin (a), a silicone-based adhesive resin, a urethane-based adhesive resin, an olefin-based adhesive resin, a styrene-based adhesive resin, and the like.

Among the above, the (meth)acrylic adhesive resin (a) is preferable from the viewpoint of facilitating the adjustment of the adhesive force and the like.

As the adhesive resin layer (A), it is also possible to use a radiation-cross-linking adhesive resin layer in which the adhesive force is decreased by radiation. The radiation cross-linking adhesive resin layer is cross-linked by the irradiation of radiation and the adhesive force is significantly reduced, thus, the adhesive film 50 is easily peeled from the electronic component. Examples of the radiation include ultraviolet rays, electron beams, infrared rays, and the like.

As the radiation cross-linking adhesive resin layer, an ultraviolet cross-linking adhesive resin layer is preferable.

Examples of the (meth)acrylic adhesive resin (a) used in the adhesive resin layer (A) include a copolymer including a (meth)acrylic acid alkyl ester monomer unit (a1) and a monomer unit (a2) having a functional group capable of reacting with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic adhesive resin (a) according to the present embodiment, for example, by copolymerizing a monomer mixture including the (meth) acrylic acid alkyl ester monomer (a1) and the monomer (a2) having a functional group capable of reacting with a cross-linking agent.

Examples of the monomer (a1) forming the (meth)acrylic acid alkyl ester monomer unit (a1) include a (meth)acrylic acid alkyl ester having an alkyl group having approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types.

In the (meth)acrylic adhesive resin (a) according to the present embodiment, when the total of all the monomer units in the (meth)acrylic adhesive resin (a) is 100% by mass, the content of the (meth)acrylic acid alkyl ester monomer unit (a1) is preferably 10% by mass or more and 98.9% by mass or less, more preferably 50% by mass or more and 97% by mass or less, and even more preferably 85% by mass or more and 95% by mass or less.

Examples of the monomer (a2) forming the monomer (a2) having a functional group capable of reacting with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl meth acrylate, acrylamide, methacrylamide, tert-butylaminoethyl acrylate, tert-butylaminoethyl methacrylate, and the like. Preferable are acrylic acid, methacrylic acid, 2-hydroxyethyl acrylate, 2-hydroxyethyl meth acrylate, acrylamide, methacrylamide, and the like. These may be used alone or in a combination of two or more types.

In the (meth)acrylic adhesive resin (a) according to the present embodiment, when the total of all the monomer units in the (meth)acrylic adhesive resin (a) is 100% by mass, the content of the monomer unit (a2) is preferably 1% by mass or more and 40% by mass or less, more preferably 1% by mass or more and 20% by mass or less, and even more preferably 1% by mass or more and 10% by mass or less.

The (meth)acrylic adhesive resin (a) according to the present embodiment may, in addition to the monomer unit (a1) and the monomer unit (a2), further include a bifunctional monomer unit (a3) and a specific comonomer (referred to below as a polymerizable surfactant) unit having properties as a surfactant.

The polymerizable surfactant has a property of copolymerizing with the monomer (a1), the monomer (a2), and the monomer (a3), and also has an action as an emulsifier in the case of emulsion polymerization.

Examples of the monomer (a3) forming the bifunctional monomer unit (a3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or, for example, monomers in which a main chain structure is a propylene glycol type with diacrylate or dimethacrylate at both ends (for example, manufactured by NOF Corp., trade name: PDP-200, PDP-400, ADP-200, and ADP-400), tetramethylene glycol type monomers (for example, manufactured by NOF Corp., trade name: ADT-250, ADT-850), mixtures thereof (for example, manufactured by NOF Corp., trade name: ADET-1800 and ADPT-4000), and the like.

In the (meth)acrylic adhesive resin (a) according to the present embodiment, when the total of all the monomer units in the (meth)acrylic adhesive resin (a) is 100% by mass, the content of the monomer unit (a3) is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by DKS Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by DKS Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic adhesive resin (a) according to the present embodiment, when the total of all the monomer units in the (meth)acrylic adhesive resin (a) is 100% by mass, the content of the polymerizable surfactant is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

The (meth)acrylic adhesive resin (a) according to the present embodiment may further include a monomer unit formed of a monomer having a polymerizable double bond such as vinyl acetate, acrylonitrile, or styrene, as necessary.

Examples of the polymerization reaction mechanism of the (meth)acrylic adhesive resin (a) according to the present embodiment include radical polymerization, anionic polymerization, cationic polymerization, and the like. In consideration of the manufacturing cost of the (meth)acrylic adhesive resin (a), the influence of the functional group of the monomer, the influence of ions on the surface of the electronic component, and the like, it is preferable to carry out the polymerization by radical polymerization.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (A) according to the present embodiment preferably further includes a cross-linking agent (A2) having two or more cross-linkable functional groups in one molecule, in addition to the adhesive resin (A1).

A cross-linking agent (A2) having two or more cross-linkable functional groups in one molecule is used to react with the functional group of the adhesive resin (A1) and adjust the adhesive force and aggregating force.

Examples of such a cross-linking agent (A2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcin diglycidyl ether; isocyanate-based compounds such as tetramethylene diisocyanate, hexamethylene diisocyanate, toluene diisocyanate 3 adducts of trimethylolpropane, polyisocyanate, diphenylmethane diisocyanate, and tolylene diisocyanate; aziridine-based compounds such as trimethylolpropane-tri-β-aziridinylpropionate, tetramethylolmethane-tri-β-aziridinylpropionate, N,N'-diphenylmethane-4,4'-bis (1-aziridinecarboxamide), N,N'-hexamethylene-1,6-bis(1-aziridinecarboxamide), N,N'-toluene-2,4-bis(1-aziridinecarboxamide), and trimethylolpropane-tri-β-(2-methylaziridine) propionate; tetrafunctional epoxy-based compounds such as N,N,N',N'-tetraglycidyl-m-xylenediamine and 1,3-bis(N,N'-diglycidylaminomethyl) cyclohexane; and melamine-based compounds such as hexamethoxymethylolmelamine. These may be used alone or in a combination of two or more types.

Among the above, it is preferable to include one type or two or more types selected from an epoxy-based compound, an isocyanate-based compound, and an aziridine-based compound.

The content of the cross-linking agent (A2) is usually preferably in a range in which the number of functional groups in the cross-linking agent (A2) does not exceed the number of functional groups in the adhesive resin (A1). However, in a case where a functional group is newly generated in the cross-linking reaction, a case where the cross-linking reaction is slow, or the like, the content thereof may be greater as necessary.

From the viewpoint of improving the balance between the heat resistance and the adhesive force of the adhesive resin layer (A), the content of the cross-linking agent (A2) in the adhesive resin layer (A) is preferably 0.1 parts by mass or more and 15 parts by mass or less with respect to 100 parts by mass of the adhesive resin (A1).

When the entire adhesive resin layer (A) is 100% by mass, the total content of the adhesive resin (A1) and the cross-linking agent (A2) in the adhesive resin layer (A) is preferably 50% by mass or more and 100% by mass or less, more preferably 70% by mass or more and 100% by mass or less, even more preferably 90% by mass or more and 100% by mass or less, and particularly preferably 95% by mass or more and 100% by mass or less. Due to this, it is possible to further suppress adhesive residue on the electronic component side when the adhesive film is peeled off from the electronic component.

The thickness of the adhesive resin layer (A) is not particularly limited, but is, for example, preferably 1 μm or more and 100 μm or less, and more preferably 3 μm or more and 50 μm or less.

It is possible to form the adhesive resin layer (A), for example, by coating an adhesive on the base material layer 10. The adhesive may be dissolved in a solvent and coated as a coating solution, coated as an aqueous emulsion, or directly coated as a liquid adhesive.

Among the above, an aqueous emulsion coating solution is preferable. Examples of the aqueous emulsion coating solution include coating solutions in which the (meth)acrylic adhesive resin (a), a silicone-based adhesive resin, a urethane-based adhesive resin, an olefin-based adhesive resin, a styrene-based adhesive resin, or the like is dispersed in water.

An adhesive coating solution dissolved in an organic solvent may be used. The organic solvent is not particularly limited and may be appropriately selected from known organic solvents in consideration of solubility and drying time. Examples of organic solvents include ester-based organic solvents such as ethyl acetate and methyl acetate; ketone-based organic solvents such as acetone and MEK; aromatic-based organic solvents such as benzene, toluene, and ethylbenzene; linear or cyclic aliphatic-based organic solvents such as heptane, hexane, and cyclohexane; alcohol-based organic solvents such as isopropanol and butanol. Ethyl acetate and toluene are preferable as the organic solvent. These solvents may be used alone as one type or used in a mixture of two or more types.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but, generally, drying for 10 seconds to 10 minutes in a temperature range of 80 to 200° C. is preferable. More preferably, drying is performed at 80 to 170° C. for 15 seconds to 5 minutes. In order to sufficiently accelerate the cross-linking reaction between the cross-linking agent and the adhesive, the adhesive coating solution may be heated at 40 to 80° C. for approximately 5 to 300 hours after drying.

In addition, the base material layer 10 and the adhesive resin layer (A) may be formed by coextrusion molding, or the film-shaped base material layer 10 and the film-shaped adhesive resin layer (A) may be formed by laminating (laminated).

<Adhesive Resin Layer (B)>

The adhesive film 50 according to the present embodiment is provided with an adhesive resin layer (B) on the second surface 10B side of the base material layer 10 on the opposite side to the first surface 10A, the adhesive force of which is decreased by an external stimulus.

Due to this, it is possible to easily peel the adhesive film 50 from the support substrate 80 by applying an external stimulus.

Here, examples of the adhesive resin layer (B), the adhesive force of which is decreased by an external stimulus, include a heat-peelable adhesive resin layer, the adhesive force of which is decreased by heating, and a radiation-peelable adhesive resin layer, the adhesive force of which is decreased by radiation, and the like.

Among the above, a heat-peelable adhesive resin layer, the adhesive force of which is decreased by heating, is preferable.

Examples of the heat-peelable adhesive resin layer include adhesive resin layers formed of a heat-expandable adhesive including a gas generating component, a heat-expandable adhesive including heat-expandable microspheres capable of expanding to decrease the adhesive force, a heat-expandable adhesive, the adhesive force of which is decreased by the cross-linking reaction of the adhesive components due to heat, or the like.

In the present embodiment, the heat-expandable adhesive used in the adhesive resin layer (B) is an adhesive, the adhesive force of which is decreased or lost by heating at a temperature over 150° C., for example. For example, it is possible to select a material which does not peel at a temperature of 150° C. or lower and which does peel at a temperature over 150° C. and the heat-expandable adhesive preferably has an adhesive force such that the adhesive film 50 does not peel from the support substrate 80 during the electronic device manufacturing step.

Here, it is possible to evaluate whether the adhesive force is decreased or lost by heating at a temperature over 150° C., for example, by attaching the adhesive resin layer (B) side to a stainless steel plate, performing a heat treatment at 140° C. for 1 hour, then heating for 2 minutes at a temperature over 150° C. and measuring the peel force from the stainless steel plate. The specific heating temperature when heating at a temperature over 150° C. is set to a temperature higher than the temperature at which the gas is generated or the temperature at which the heat-expandable microspheres are heat-expanded and is appropriately set depending on the gas to be generated or the type of heat-expandable microspheres. In the present embodiment, the loss of adhesive force means, for example, a case where the 180° peel force measured under the conditions of 23° C. and a tensile speed of 300 mm/min becomes less than 0.5 N/25 mm.

As the gas generating component used in the heat-expandable adhesive, for example, it is possible to use an azo compound, an azide compound, a Meldrum's acid derivative, or the like. In addition, it is also possible to use inorganic foaming agents such as ammonium carbonate, ammonium hydrogencarbonate, sodium hydrogencarbonate, ammonium nitrite, sodium borohydride, and various azides, or water; salts of fluoroalkane-based compounds such as trichloromonofluoromethane and dichloromonofluoromethane; azo-based compounds such as azobisisobutyronitrile, azodicarbonamide, and barium azodicarboxylate; hydrazine-based compounds such as paratoluenesulfonyl hydrazide, diphenylsulfone-3,3'-disulfonylhydrazide, 4,4'-oxybis(benzenesulfonyl hydrazide) and allylbis(sulfonylhydrazide); semicarbazide-based compounds such as p-toluylenesulfonyl semicarbazide, and 4,4'-oxybis(benzenesulfonyl semicarbazide); triazole-based compounds such as 5-morpholyl-1,2,3,4-thiatriazole; organic foaming agents such as N-nitroso compounds such as N,N'-dinitrosopentamethylenetetramine, and N,N'-dimethyl-N,N'-dinitrosoterephthalamide, and the like. The gas generating component may be added to the adhesive resin (B1) or may be directly bonded to the adhesive resin (B1).

As the heat-expandable microspheres used for the heat-expandable adhesive, for example, it is possible to use a microencapsulated foaming agent. Examples of such heat-expandable microspheres include microspheres in which a substance that is easily gasified and expanded by heating such as isobutane, propane, and pentane is sealed in a shell having elasticity, or the like. Examples of the material forming the shell include vinylidene chloride-acrylonitrile copolymer, polyvinyl alcohol, polyvinyl butyral, polymethyl methacrylate, polyacrylonitrile, polyvinylidene chloride, polysulfone, and the like. It is possible to manufacture heat-expandable microspheres by, for example, a coacervation method, an interfacial polymerization method, or the like.

It is possible to add heat-expandable microspheres to the adhesive resin.

It is possible to appropriately set the content of at least one type selected from the gas generating component and the heat-expandable microspheres according to the expansion ratio and the decrease in adhesive force of the heat-peelable adhesive resin layer (B) and the like without being particularly limited; however, for example, with respect to 100 parts by mass of the adhesive resin (B1) in the heat-peelable adhesive resin layer (B), the content is, for instance, 1 part by mass or more and 150 parts by mass or less, preferably 10 parts by mass or more and 130 parts by mass or less, and more preferably 12 parts by mass or more and 100 parts by mass or less.

It is preferable to implement the design such that the temperature at which gas is generated or the temperature at which the heat-expandable microspheres heat-expand is over 150° C.

Examples of the adhesive resin (B1) forming the heat-expandable adhesive include (meth)acrylic resin (b), urethane-based resin, silicone-based resin, polyolefin-based resin, polyester-based resin, polyamide-based resin, fluorine resin-based resins, styrene-diene block copolymer-based resins, and the like. Among these, the (meth)acrylic resin (b) is preferable.

Examples of the (meth)acrylic adhesive resin (b) used in the adhesive resin layer (B) include a copolymer including the (meth)acrylic acid alkyl ester monomer unit (b1) and the monomer unit (b2) having a functional group capable of reacting with a cross-linking agent.

In the present embodiment, (meth)acrylic acid alkyl ester means acrylic acid alkyl ester, methacrylic acid alkyl ester, or a mixture thereof.

It is possible to obtain the (meth)acrylic adhesive resin (b) according to the present embodiment, for example, by copolymerizing a monomer mixture including a (meth)acrylic acid alkyl ester monomer (b1) and a monomer (b2) having a functional group capable of reacting with a cross-linking agent.

Examples of the monomer (b1) forming the (meth)acrylic acid alkyl ester monomer unit (b1) include a (meth)acrylic acid alkyl ester having an alkyl group having approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types.

In the (meth)acrylic adhesive resin (b) according to the present embodiment, when the total of all the monomer units in the (meth)acrylic adhesive resin (b) is 100% by mass, the content of the (meth)acrylic acid alkyl ester monomer unit (b1) is preferably 10% by mass or more and 98.9% by mass or less, more preferably 50% by mass or more and 97% by mass or less, and even more preferably 85% by mass or more and 95% by mass or less.

Examples of the monomer (b2) forming the monomer (b2) having a functional group capable of reacting with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylic acid, acrylamide, methacrylamide, tert-butylaminoethyl acrylate, tert-butylaminoethyl methacrylate, and the like. Preferable examples are acrylic acid, methacrylic acid, 2-hydroxyethyl acrylate, 2-hydroxyethyl methacrylic acid, acrylamide, methacrylamide, and the like. These may be used alone or in a combination of two or more types.

In the (meth)acrylic adhesive resin (b) according to the present embodiment, when the total of all the monomer units in the (meth)acrylic adhesive resin (b) is 100% by mass, the content of the monomer unit (b2) is preferably 1% by mass or more and 40% by mass or less, more preferably 1% by mass or more and 20% by mass or less, and even more preferably 1% by mass or more and 10% by mass or less.

The (meth)acrylic adhesive resin (b) according to the present embodiment may further include a bifunctional monomer unit (b3) and a specific comonomer (referred to below as a polymerizable surfactant) unit having a property as a surfactant in addition to the monomer unit (b1) or the monomer unit (b2).

The polymerizable surfactant has a property of copolymerizing with the monomer (b1), the monomer (b2), and the monomer (b3), and has an action as an emulsifier in a case of emulsion polymerization.

Examples of the monomer (b3) forming the bifunctional monomer unit (b3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or, for example, monomers in which a main chain structure is a propylene glycol type with diacrylate or dimethacrylate at both ends (for example, manufactured by NOF Corp., trade name: PDP-200, PDP-400, ADP-200, and ADP-400), tetramethylene glycol type monomers (for example, manufactured by NOF Corp., trade name: ADT-250, ADT-850), mixtures thereof (for example, manufactured by NOF Corp., trade name: ADET-1800 and ADPT-4000), and the like.

In the (meth)acrylic adhesive resin (b) according to the present embodiment, when the total of all the monomer units in the (meth)acrylic adhesive resin (b) is 100% by mass, the content of the monomer unit (b3) is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by DKS Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by DKS Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic adhesive resin (b) according to the present embodiment, when the total of all the monomer units in the (meth)acrylic adhesive resin (b) is 100% by mass, the content of the polymerizable surfactant is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

The (meth)acrylic adhesive resin (b) according to the present embodiment may further contain, as necessary, a monomer unit formed of a monomer having a polymerizable double bond such as vinyl acetate, acrylonitrile, or styrene.

Examples of the polymerization reaction mechanism of the (meth)acrylic adhesive resin (b) according to the present embodiment include radical polymerization, anionic polymerization, cationic polymerization, and the like. In consideration of the manufacturing cost of the (meth)acrylic adhesive resin (b), the influence of the functional group of the monomer, the influence of ions on the surface of the electronic component, and the like, it is preferable to carry out the polymerization by radical polymerization.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; and azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and, similarly, azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

From the viewpoint of further suppressing the position shifting of the electronic component in the sealing step, the adhesive resin layer (B) according to the present embodiment preferably further includes a cross-linking agent (B2) having two or more cross-linkable functional groups in a molecule in addition to the adhesive resin (B1).

A cross-linking agent (B2) having two or more cross-linkable functional groups in one molecule is used to adjust the adhesive force and aggregating force by reacting with the functional group of the adhesive resin (B1).

Examples of the cross-linking agent (B2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcin diglycidyl ether; isocyanate-based compounds such as tetramethylene diisocyanate, hexamethylene diisocyanate, toluene diisocyanate 3 adducts of trimethylolpropane, polyisocyanate, diphenylmethane diisocyanate, and tolylene diisocyanate; aziridine-based compounds such as trimethylolpropane-tri-β-aziridinylpropionate, tetramethylolmethane-tri-β-aziridinylpropionate, N,N'-diphenylmethane-4,4'-bis (1-aziridinecarboxamide), N,N'-hexamethylene-1,6-bis(1-aziridinecarboxamide), N,N'-toluene-2,4-bis(1-aziridinecarboxamide), and trimethylolpropane-tri-β-(2-methylaziridine) propionate; tetrafunctional epoxy-based compounds such as N,N,N',N'-tetraglycidyl-m-xylenediamine and 1,3-bis (N,N'-diglycidylaminomethyl) cyclohexane; and melamine-based compounds such as hexamethoxymethylolmelamine, and the like. These may be used alone or in a combination of two or more types.

Among the above, it is preferable to include one type or two or more types selected from epoxy-based compounds, isocyanate-based compounds, and aziridine-based compounds.

The content of the cross-linking agent (B2) is usually preferably in an approximate range in which the number of functional groups in the cross-linking agent (B2) does not exceed the number of functional groups in the adhesive resin (B1). However, in a case where a functional group is newly generated in the cross-linking reaction, a case where the cross-linking reaction is slow, or the like, the content thereof may be greater as necessary.

From the viewpoint of further suppressing the position shifting of the electronic component in the sealing step, the content of the cross-linking agent (B2) in the adhesive resin layer (B) is preferably 0.1 parts by mass or more and 10 parts by mass or less with respect to 100 parts by mass of the adhesive resin (B1), and more preferably 0.5 parts by mass or more and 5 parts by mass or less.

When the entire adhesive resin layer (B) is 100% by mass, the total content of the adhesive resin (B1) and the cross-linking agent (B2) in the adhesive resin layer (B) is preferably 50% by mass or more and 100% by mass or less, more preferably 70% by mass or more and 100% by mass or less, even more preferably 90% by mass or more and 100% by mass or less, and particularly preferably 95% by mass or more and 100% by mass or less. Due to this, it is possible to further suppress position shifting of the electronic component in the sealing step.

When the total of the adhesive resin layer (B) is 100% by mass, the total content of at least one type selected from the adhesive resin (B1), the cross-linking agent (B2), and the gas generating component and the heat-expandable microspheres in the adhesive resin layer (B) is preferably 50% by mass or more and 100% by mass or less, more preferably 70% by mass or more and 100% by mass or less, even more preferably 90% by mass or more and 100% by mass or less, and particularly preferably 95% by mass or more and 100% by mass or less.

In addition, from the viewpoint of stably holding the electronic component on the adhesive resin layer (A) when an external stimulus is applied so as to decrease the adhesive force of the adhesive resin layer (A) and peel the support substrate from the adhesive resin layer (B), in the adhesive film 50 according to the present embodiment, when the total of the adhesive resin layer (A) is 100% by mass, the content of at least one type selected from the gas generating component and the heat-expandable microspheres in the adhesive resin layer (A) is preferably 0.1% by mass or less, more preferably 0.05% by mass or less, even more preferably 0.01% by mass or less, and particularly preferably such that at least one type selected from a gas generating component and heat-expandable microspheres is not included in the adhesive resin layer (A).

From the viewpoint of improving the adhesion to the support substrate, the adhesive resin layer (B) according to the present embodiment preferably includes a tackifying resin in addition to the adhesive resin (B1). It is preferable for the adhesive resin layer (B) to contain a tackifying resin in order to easily adjust the adhesion with the support substrate at around room temperature. The tackifying resin preferably has a softening point of 100° C. or higher. Specific examples of the tackifying resin include rosin-based resins such as rosin-based derivatives subjected to esterification and the like; terpene-based resins such as α-pinene-based, β-pinene-based, dipentene-based, and terpene-phenol-based resins; natural rosins such as gum-based, wood-based, and tall oil-based rosins; hydrogenated, disproportionated, polymerized, maleated, petroleum resins in these natural rosins; coumarone-indene resins and the like.

Among the above, examples having a softening point in a range of 100 to 160° C. are more preferable, and examples having a softening point in a range of 120 to 150° C. are particularly preferable. When the tackifying resin having a softening point in the range described above is used, not only is the contamination and adhesive residue on the support substrate small, but it is possible to further improve the adhesion to the support substrate in a working environment. Further, when a polymerized rosin ester-based tackifying resin is used as the tackifying resin, not only is contamination and adhesive residue on the support substrate small, but the adhesion with the support substrate in an environment of 80 to 130° C. also improves and, after expansion of the heat-expandable microspheres, it is possible to more easily carry out the peeling from the support substrate.

The blending ratio of the tackifying resin may be appropriately selected such that it is possible to adjust the elastic modulus of the adhesive resin layer (B) in a desired predetermined numerical range, without being particularly limited. However, from the viewpoint of the elastic modulus of the adhesive resin layer (B) and the initial peeling force, the blending ratio is preferably 1 to 100 parts by mass with respect to 100 parts by mass of the adhesive resin (B1). When the blending ratio of the tackifying resin is the lower limit value described above or more with respect to 100 parts by mass of the adhesive resin (B1), the adhesion with the support substrate during work tends to be good. On the other hand, when the blending ratio is the upper limit value described above or less, the sticking property to the support substrate at room temperature tends to be good. From the viewpoint of adhesion to the support substrate and sticking property at room temperature, the blending ratio of the tackifying resin is more preferably 2 to 50 parts by mass with respect to 100 parts by mass of the adhesive resin (B1). In addition, the acid value of the tackifying resin is preferably 30 or less. If the acid value of the tackifying resin is the upper limit value described above or less, adhesive residue tends to be less likely to occur on the support substrate during peeling.

The thickness of the adhesive resin layer (B) is not particularly limited, but, for example, is preferably 5 μm or more and 300 μm or less, and more preferably 20 μm or more and 150 μm or less.

It is possible to form the adhesive resin layer (B), for example, by a method for coating an adhesive coating solution on the base material layer 10, a method for transferring the adhesive resin layer (B) formed on the separator onto the base material 10, and the like.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but, generally, drying for 10 seconds to 10 minutes in a temperature range of 80 to 200° C. is preferable. More preferably, drying is performed at 80 to 170° C. for 15 seconds to 5 minutes. In order to sufficiently accelerate the cross-linking reaction between the cross-linking agent and the adhesive, the adhesive coating solution may be heated at 40 to 80° C. for approximately 5 to 300 hours after drying.

In addition, the base material layer 10 and the adhesive resin layer (B) may be formed by coextrusion molding, or the film-shaped base material layer 10 and the film-shaped adhesive resin layer (B) may be formed by laminating (laminated).

<Other Layers>

The adhesive film 50 according to the present embodiment may be further provided with, for example, an uneven absorption layer, a shock absorption layer, an easy-adhesion layer, or the like, between the base material layer 10 and the adhesive resin layer (A) or between the base material layer 10 and the adhesive resin layer (B) as long as the effect of the present embodiment is not impaired.

The uneven absorption layer is preferably formed of a natural rubber, a synthetic rubber, or a synthetic resin having rubber elasticity having a Shore D type hardness according to D type Shore of ASTM D-2240 of, for example, 50 or less, preferably 40 or less. The thickness of the uneven absorption layer is, for example, 500 μm or less, preferably 5 to 300 μm, and more preferably 10 to 150 μm.

Examples of the synthetic rubber and synthetic resin include nitrile-based, diene-based and acrylic-based synthetic rubbers, polyolefin-based and polyester-based thermoplastic elastomers, synthetic resins having elasticity such as ethylene-vinyl acetate copolymers, polyurethane, polybutadiene, and soft polyvinyl chloride. Here, in the present embodiment, even with an essentially hard polymer such as polyvinyl chloride, it is also possible to use an example which has rubber elasticity in combination with a compounding agent such as a plasticizer or a softener. In addition, it is possible to preferably use the adhesive resins and the like exemplified in the adhesive resin layer (A) and adhesive resin layer (B) described above for forming the uneven absorption layer.

A description was given above of the embodiments of the present invention, but these are Examples of the present invention and it is also possible to adopt various configurations other than the above.

Here, the present invention is not limited to the embodiments described above and modifications, improvements, and the like in a range in which it is possible to achieve the object of the present invention are included in the present invention.

EXAMPLES

A specific description will be given below of the present invention with reference to Examples, but the present invention is not limited thereto.

Details of the materials used to manufacture the adhesive film are as follows.

<Adhesive Resin Solution SA1>

Into deionized pure water, 0.5 parts by mass of 4,4'-azobis-4-cyanovaleric acid (manufactured by Otsuka Chemical Co., Ltd.; trade name: ACVA) as a polymerization initiator, 74.3 parts by mass of acrylic acid-n-butyl and 13.7 parts by mass of methyl methacrylate as the monomer (a1), 9 parts by mass of 2-hydroxyethyl methacrylate as the monomer (a2), and 3 parts by mass of a polymerizable surfactant in which a polymerizable 1-propenyl group was introduced into a benzene ring of ammonium salt of sulfuric acid ester of polyoxyethylene nonylphenyl ether (manufactured by DKS Co., Ltd.; trade name: Aqualon HS-1025) were each added, and emulsion polymerization was carried out for 8 hours at 70 to 72° C. while stirring to obtain an acrylic-based resin emulsion. The result was neutralized with aqueous ammonia (pH=7.0) to obtain an adhesive resin solution SA1 having a solid content concentration of 42.5%.

<Adhesive Resin Solution SA2>

Into deionized pure water, 0.5 parts by mass of ammonium persulfate as a polymerization initiator, 63 parts by mass of 2-ethylhexyl acrylate, 21 parts by mass of acrylic acid-n-butyl, and 9 parts by mass of methyl methacrylate as the monomer (a1), 3 parts by mass of 2-hydroxyethyl methacrylate as the monomer (a2), 1 part by mass of polytetramethylene glycol diacrylate (manufactured by NOF Corp.; trade name; ADT-250) as a monomer (a3), and 2 parts by mass of a polymerizable surfactant in which a polymerizable 1-propenyl group was introduced into a benzene ring of an ammonium salt of a sulfuric acid ester of polyoxyethylene nonylphenyl ether (manufactured by DKS Co., Ltd.; trade name: Aqualon HS-1025) were each added, and emulsion polymerization was carried out for 8 hours at 70 to 72° C. while stirring to obtain an acrylic-based resin emulsion. The result was neutralized with aqueous ammonia (pH=7.0) to obtain an adhesive resin solution SA2 having a solid content concentration of 56.5%.

<Adhesive Coating Solution A1>

57.4 parts by mass of adhesive resin solution SA1, 42.6 parts by mass of adhesive resin solution SA2, 0.4 parts by mass of dimethylethanolamine, and 3.4 parts by mass of an epoxy-based compound (Ex-1610, manufactured by Nagase Chemtex Corp.) as a cross-linking agent were mixed together to obtain an adhesive coating solution A1.

<Adhesive Resin Solution SB1>

In a mixed solvent including ethyl acetate and toluene, 0.536 parts by mass of t-butylperoxy-2-ethylhexanoate (manufactured by NOF Corp.; trade name: Perbutyl O (registered trademark)) as a polymerization initiator, 34.9 parts by weight of 2-ethylhexyl acrylate, 41 parts by mass of acrylic acid-n-butyl, and 14.7 parts by mass of ethyl acrylate as monomer (b1), 9.4 parts by mass of 2-hydroxyethyl methacrylate as monomer (b2) were each added and solution polymerization was carried out at 83 to 87° C. for 11 hours while stirring to obtain an acrylic-based resin solution having a solid content concentration of 45% by mass. The result was set as the adhesive resin solution SB1.

<Adhesive Coating Solution B1>

100 parts by mass of the adhesive resin solution SB1 and 0.9 parts by mass (2 parts by mass with respect to 100 parts by mass of the adhesive resin) of an isocyanate-based cross-linking agent (manufactured by Mitsui Chemicals, Inc.; trade name: Olester P49-75S) were each mixed and the solid content concentration was adjusted to 40% with ethyl acetate to obtain an adhesive coating solution B1.

<Adhesive Coating Solution B2>

100 parts by mass of the adhesive resin solution SB1, 2.25 parts by weight of a polymerized rosin ester-based tackifier (manufactured by Arakawa Chemical Industries, Ltd.; trade name: Pensel D-125) (5 parts by mass with respect to 100 parts by mass of adhesive resin), 1.2 parts by mass of an isocyanate-based cross-linking agent (manufactured by Mitsui Chemicals, Inc.; trade name: Olester P49-75S) (2 parts by mass with respect to 100 parts by mass of adhesive resin), 6.75 parts by mass of heat-expandable microspheres (Sekisui Chemical Co., Ltd.; trade name: Advancell EM-503) (15 parts by mass with respect to 100 parts by mass of the adhesive resin), were each mixed and the solid content concentration was adjusted to 30% with ethyl acetate to prepare an adhesive coating solution B2.

Example 1

The adhesive coating solution A1 was coated on a polyethylene terephthalate (PET) film (thickness 38 μm), which is a base material layer, and then dried to form the adhesive resin layer (A) with a thickness of 10 μm. Then, the adhesive coating solution B1 is coated on the surface of the PET film on the opposite side to the adhesive resin layer (A) and dried to form an uneven absorption layer with a thickness of 20 μm, then a heat-peelable adhesive resin layer (B) with a thickness of 30 μm was formed by coating and drying the adhesive coating solution B2 thereon to obtain an adhesive film.

The adhesive resin layer (B) side of the obtained adhesive film is adhered on a 320 mm square SUS substrate, and, as an electronic component, 5 mm square semiconductor chips were mounted to be adhered on the adhesive resin layer (A) of the adhesive film so as to form a grid pattern with 2 mm intervals, next, the adhesive force of the adhesive resin layer (A) and adhesive resin layer (B) is stabilized by carrying out a heating treatment for 30 minutes at 130° C. to obtain a structure.

Two days after obtaining the structure, the obtained structure was heat-treated at 100° C. for 20 minutes to decrease the water content in the structure.

Ten minutes after the structure was heat-treated, using a compression molding machine, a plurality of semiconductor chips on the adhesive resin layer (A) were sealed by compression molding at 135° C. with a granulated epoxy resin-based sealing material (manufactured by Sumitomo Bakelite Co., Ltd., product name: G730).

Next, position shifting of the semiconductor chip was visually observed. As a result, no position shifting of the semiconductor chip was observed.

Comparative Example 1

The position shifting of the semiconductor chip was observed in the same manner as in Example 1 except that a step of heat-treating the structure at 100° C. for 20 minutes and decreasing the water content in the structure was not performed.

As a result, a spot where the semiconductor chip flew off was observed. That is, in Comparative Example 1, position shifting of the semiconductor chip was observed.

This application claims priority based on Japanese Patent Application No. 2018-066900 filed on Mar. 30, 2018, and all of the disclosure thereof is incorporated herein.

The invention claimed is:

1. A method for manufacturing an electronic device, comprising at least:
   a step (1) of preparing a structure having:
      an adhesive film having:
         a base material layer;
         an adhesive resin layer (A) for temporarily fixing an electronic component, which is provided on a first surface side of the base material layer; and
         an adhesive resin layer (B) in which an adhesive force is decreased by an external stimulus, which is provided on a second surface side of the base material layer;
      an electronic component attached to the adhesive resin layer (A) of the adhesive film; and
      a support substrate attached to the adhesive resin layer (B) of the adhesive film;
   at least one step (2) selected from a step (2-1) of decreasing water content in the adhesive film and a step (2-2) of decreasing water content in the structure; and
   a step (3) of sealing the electronic component with a sealing material.

2. The method for manufacturing an electronic device according to claim 1,
   wherein the step (2) includes the step (2-1) of decreasing the water content in the adhesive film, and
   the step (2-1) is performed before the step (1).

3. The method for manufacturing an electronic device according to claim 2,
   wherein, in the step (2-1), the water content in the adhesive film is decreased by heating the adhesive film and/or depressurizing the adhesive film.

4. The method for manufacturing an electronic device according to claim 1,
   wherein the step (2) includes the step (2-2) of decreasing the water content in the structure, and
   the step (2-2) is performed between the step (1) and the step (3).

5. The method for manufacturing an electronic device according to claim 4,
   wherein, in the step (2-2), the water content in the structure is decreased by heating the structure and/or depressurizing the structure.

6. The method for manufacturing an electronic device according to claim 4,
   wherein the step (2) is performed immediately before the step (3).

7. The method for manufacturing an electronic device according to claim 1, further comprising:
   a step (4) of peeling the support substrate from the structure by decreasing an adhesive force of the adhesive resin layer (B) by applying an external stimulus, after the step (3).

8. The method for manufacturing an electronic device according to claim 7, further comprising:
   a step (5) of peeling the adhesive film from the electronic component, after the step (4).

9. The method for manufacturing an electronic device according to claim 1,
   wherein an interval between the step (2) and the step (3) is within 12 hours.

10. The method for manufacturing an electronic device according to claim 1, wherein the sealing material is an epoxy resin-based sealing material.

11. The method for manufacturing an electronic device according to claim 1,
wherein the adhesive resin layer (A) includes a (meth) acrylic adhesive resin.

* * * * *